United States Patent
Ishizawa et al.

(10) Patent No.: US 8,802,989 B2
(45) Date of Patent: Aug. 12, 2014

(54) CONDUCTIVE MATERIAL AND CONNECTION STRUCTURE

(71) Applicant: Sekisui Chemical Co., Ltd., Osaka (JP)

(72) Inventors: Hideaki Ishizawa, Osaka (JP); Takashi Kubota, Osaka (JP)

(73) Assignee: Sekisui Chemical Co., Ltd., Osaka (JP)

( * ) Notice: Subject to any disclaimer, the term of this patent is extended or adjusted under 35 U.S.C. 154(b) by 0 days.

(21) Appl. No.: 14/123,195

(22) PCT Filed: Mar. 22, 2013

(86) PCT No.: PCT/JP2013/058346
§ 371 (c)(1),
(2), (4) Date: Nov. 29, 2013

(87) PCT Pub. No.: WO2013/146604
PCT Pub. Date: Oct. 3, 2013

(65) Prior Publication Data
US 2014/0083740 A1    Mar. 27, 2014

(30) Foreign Application Priority Data
Mar. 26, 2012   (JP) ................. 2012-069786

(51) Int. Cl.
*H01B 5/00*      (2006.01)
*C22C 1/05*      (2006.01)
*H01B 1/22*      (2006.01)

(52) U.S. Cl.
CPC ....................................... *H01B 1/22* (2013.01)
USPC ........................................ 174/126.1; 75/255

(58) Field of Classification Search
CPC ........................................................ H01B 1/22
USPC ........................................ 174/126.1; 75/255
See application file for complete search history.

(56) References Cited

U.S. PATENT DOCUMENTS

| 6,812,065 B1 | 11/2004 | Kitamura |
| 2004/0016911 A1* | 1/2004 | Khanna ........................ 252/500 |
| 2004/0079194 A1* | 4/2004 | Nakata et al. ................... 75/255 |
| 2008/0099733 A1* | 5/2008 | Kim et al. ..................... 252/511 |
| 2012/0248495 A1 | 10/2012 | Umakoshi et al. |
| 2013/0000964 A1 | 1/2013 | Kobayashi et al. |

FOREIGN PATENT DOCUMENTS

| CN | 1310848 A | 8/2001 |
| JP | 2006-108523 A | 4/2006 |
| JP | 2009-102731 A | 5/2009 |
| JP | 2012-19203 A | 1/2012 |
| JP | 2013-33735 A | 2/2013 |
| WO | WO-2011/132658 A1 | 10/2011 |

OTHER PUBLICATIONS

International Search Report for the Application No. PCT/JP2013/058346 mailed May 14, 2013.
Written Opinion of the International Searching Authority (PCT/ISA/237) for Application No. PCT/JP2013/058346 mailed May 14, 2013.
Taiwanese Office Action for the Application No. 102110764 dated Nov. 18, 2013.

* cited by examiner

*Primary Examiner* — Timothy Thompson
*Assistant Examiner* — Rhadames J Alonzo Miller
(74) *Attorney, Agent, or Firm* — Cheng Law Group, PLLC

(57) ABSTRACT

The conductive material according to the present invention includes a binder resin and conductive particles each having a solder at a conductive surface, the binder resin includes a curable compound capable of being cured by heating, and a thermal curing agent, and when the binder resin and the solder in the conductive particle are each heated at a temperature rising rate of 10° C./minute to perform differential scanning calorimetry, an exothermic peak top temperature in curing of the binder resin is lower than an endothermic peak top temperature in melting of the solder.

12 Claims, 6 Drawing Sheets

CONDUCTIVE MATERIAL AND CONNECTION STRUCTURE

TECHNICAL FIELD

The present invention relates to a conductive material including conductive particles each having a solder at a conductive surface, and relates to, for example, a conductive material which can be used for electrically connecting electrodes of various connection object members such as a flexible printed circuit board, a glass board, a glass epoxy board and a semiconductor chip. The present invention also relates to a connection structure using the conductive material.

BACKGROUND ART

Paste-like and film-like anisotropic conductive materials are widely known. In the anisotropic conductive material, a plurality of conductive particles are dispersed in a binder resin.

The anisotropic conductive material is used for, for example, connection of a flexible printed circuit board and a glass board (FOG (Film on Glass)), connection of a semiconductor chip and a flexible printed circuit board (COF (Chip on Film)), connection of a semiconductor chip and a glass board (COG (Chip on Glass)), connection of a flexible printed circuit board and a glass epoxy board (FOB (Film on Board)) and so on in order to obtain various kinds of connection structures.

For example, when an electrode of a semiconductor chip and an electrode of a glass board are electrically connected by the anisotropic conductive material, an anisotropic conductive material including conductive particles is arranged on the glass board. Next, the semiconductor chip is laminated, and the laminate is heated and pressurized. As a result, the anisotropic conductive material is cured, the electrodes are electrically connected via conductive particles, and thereby a connection structure is obtained.

As one example of the anisotropic conductive material, Patent Document 1 discloses an anisotropic conductive paste including an insulating resin and a solder particle component. This anisotropic conductive paste may include particles for destructing oxide film. The patent document 1 describes, as the solder particle component, a particle formed by coating the surface of a core with a solder component, and, as the above core, a particle of one selected from the group consisting of a solder, a resin, a ceramic and a metal is used. In Example in Patent Document 1, however, there is no description, as a solder particle component, of a particle formed by coating the surface of a core which is a resin with a solder component.

RELATED ART DOCUMENT

Patent Document

Patent Document 1: JP 2006-108523 A

SUMMARY OF THE INVENTION

Problems to be Solved by the Invention

When the connection structure is obtained by using a conventional anisotropic conductive material as described in Patent Document 1, the connection resistance between electrodes may increase in the obtained connection structure. Therefore, conduction reliability in the connection structure may be low.

An object of the present invention is to provide a conductive material capable of decreasing the connection resistance of a connection structure when the connection structure is obtained by electrically connecting electrodes, and a connection structure using the conductive material.

Means for Solving the Problems

According to a broad aspect of the present invention, there is provided a conductive material including: a binder resin; and conductive particles each having a solder at a conductive surface, wherein the binder resin includes a curable compound capable of being cured by heating, and a thermal curing agent, and an exothermic peak top temperature in curing of the binder resin is lower than an endothermic peak top temperature in melting of the solder, when the binder resin and the solder in the conductive particles are each heated at a temperature rising rate of 10° C./minute to perform differential scanning calorimetry.

In a specific aspect of the conductive material according to the present invention, a difference between the exothermic peak top temperature in curing of the binder resin and the endothermic peak top temperature in melting of the solder is 30° C. or less.

In another specific aspect of the conductive material according to the present invention, there is an overlap between a temperature range of an exothermic peak in curing of the binder resin and a temperature range of an endothermic peak in melting of the solder, when the differential scanning calorimetry is performed.

In another specific aspect of the conductive material according to the present invention, there is an overlap between a temperature range of an exothermic peak part in curing of the binder resin, which shows an exothermic amount equal to or more than 1/10 of an exothermic amount at the exothermic peak top in curing of the binder resin and a temperature range of an endothermic peak part in melting of the solder, which shows an endothermic amount equal to or more than 1/10 of an endothermic amount at the endothermic peak top in melting of the solder, when the differential scanning calorimetry is performed.

In still another specific aspect of the conductive material according to the present invention, the thermal curing agent includes a thermal cation generator.

In another specific aspect of the conductive material according to the present invention, the thermal curing agent includes a thermal radical generator.

In another specific aspect of the conductive material according to the present invention, the conductive particle includes a base material particle and a solder layer arranged on the surface of the base material particle.

In another specific aspect of the conductive material according to the present invention, the binder resin includes a flux.

The connection structure according to the present invention includes: a first connection object member having a first electrode at a surface; a second connection object member having a second electrode at a surface; and a connection part connecting the first and second connection object members, wherein the connection part is formed by the conductive material, and the first electrode and the second electrode are electrically connected by the conductive particles.

Effect of the Invention

A conductive material according to the present invention includes a binder resin, and conductive particles each having a solder at a conductive surface, the binder resin includes a curable compound capable of being cured by heating, and a thermal curing agent, and an exothermic peak top temperature in curing of the binder resin is lower than an endothermic peak top temperature in melting of the solder when the binder resin and the solder in the conductive particles are each heated at a temperature rising rate of 10° C./minute to perform differential scanning calorimetry. Therefore, the connection resistance of a connection structure can be decreased when the connection structure is obtained by electrically connecting electrodes by using the conductive material of the present invention.

MODE(S) FOR CARRYING OUT THE INVENTION

Details of the present invention will be described below.

A conductive material according to the present invention includes a binder resin and conductive particles. The conductive particle has a solder at a conductive surface. The binder resin includes a curable compound capable of being cured by heating, and a thermal curing agent. The binder resin is a component other than the conductive particle, which is included in the conductive material. The conductive material according to the present invention is a conductive material capable of being cured by heating. In the conductive material according to the present invention, the solder in the conductive particle can be melted by heating for curing the binder resin.

Figure 1:
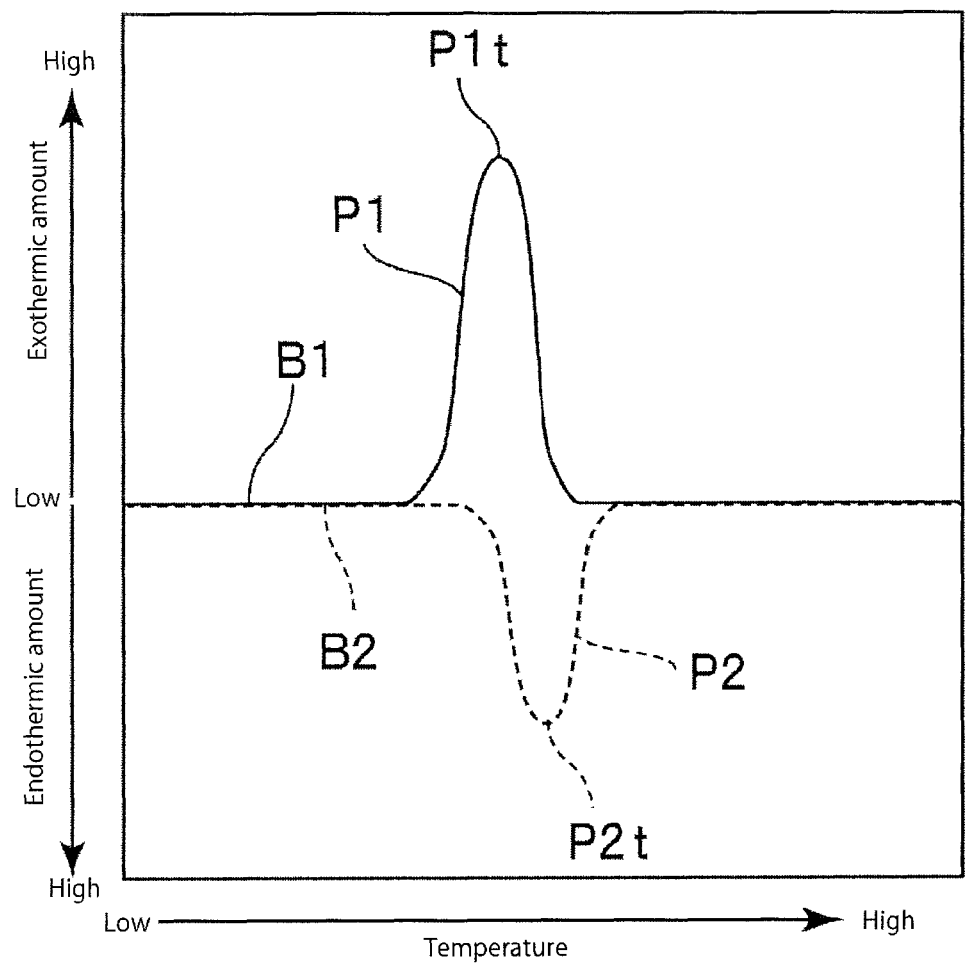
FIG. 1 is a schematic view showing one example of a relationship between an exothermic peak in curing of a binder resin and an endothermic peak in melting of a solder of a conductive particle in differential scanning calorimetry.

The binder resin is heated at a temperature rising rate of 10° C./minute to perform differential scanning calorimetry (DSC). Further, the solder in the conductive particle is heated at a temperature rising rate of 10° C./minute to perform differential scanning calorimetry (DSC). In the conductive material according to the present invention, an exothermic peak top P1t temperature in curing of the binder resin is lower than an endothermic peak top P2t temperature in melting of the solder in the DSC as schematically shown in FIG. 1. The exothermic peak top P1t and the endothermic peak top P2t shows a temperature at which an exothermic amount or an endothermic amount at an exothermic peak P1 or an endothermic peak P2 is the highest. The exothermic peak P1 shows a part extending from a point at which the exothermic amount starts to increase from a baseline B1, through the exothermic peak top P1t, then to the baseline B1 to which the exothermic amount decreases. The endothermic peak P2 shows a part extending from a point at which the endothermic amount starts to increase from a baseline B2, to the endothermic peak top P2t, then to the baseline B2 to which the endothermic amount decreases. The exothermic peak P1 showing the exothermic peak top P1t temperature in curing of the binder resin is preferably a main exothermic peak at which the exothermic amount is the highest. In order to ensure that the exothermic peak top P1t temperature and the endothermic peak top P2t temperature satisfy the above-described relationship, the type of the curing agent in the binder resin, the composition of the solder, and so on can be appropriately adjusted.

Owing to employment of the above-described configuration in the conductive material according to the present invention, the connection resistance of a connection structure can be effectively decreased when the connection structure is obtained by electrically connecting electrodes using the conductive material according to the present invention. Further, a connection failure in the connection structure is hard to occur. The reason for this is considered to be that the solder (solder layer, etc.) starts to melt after curing of the binder resin is started due to heating for obtaining the connection structure, and therefore the solder is not greatly diffused, resulting in sufficient metallic-connection between the solder and the electrode. To the contrary, when the exothermic peak top P1t temperature is equal to or higher than the endothermic peak top P2t temperature, the connection resistance of the connection structure increases.

Further, owing to employment of the above-described configuration in the conductive material according to the present invention, the connection resistance between electrodes is hard to increase even if the connection structure is placed under a high temperature and high humidity or exposed to a thermal shock such as a cooling/heating cycle. This is considered to be because adhesion between the conductive particle and the electrode is enhanced in the connection structure.

A difference between the exothermic peak top P1t temperature in curing of the binder resin and the endothermic peak top P2t temperature in melting of the solder is more than 0° C. and is preferably 30° C. or less, more preferably 20° C. or less, further preferably 10° C. or less. When the difference in temperatures is equal to or higher than the above-mentioned lower limit and is equal to or lower than the above-mentioned upper limit, the connection resistance in the connection structure effectively decreases, so that connection reliability in the connection structure under a high temperature and high humidity and a thermal shock is further enhanced. A difference between the exothermic peak top P1t temperature in curing of the binder resin and the endothermic peak top P2t temperature in melting of the solder may be more than 10° C., may be more than 20° C. or may be more than 30° C.

Preferably, there is an overlap between a temperature range of the exothermic peak P1 in curing of the binder resin and a temperature range of the endothermic peak P2 in melting of the solder. In this case, timing for the binder resin to melt can be made further close to timing for the solder to melt during heating in the connection structure. As a result, the connection resistance in the connection structure effectively decreases, and connection reliability in the connection structure under a high temperature and high humidity and a thermal shock is further enhanced.

Preferably, there is an overlap between a temperature range of an exothermic peak P1 part in curing of the binder resin, which shows an exothermic amount equal to or more than 1/10 of an exothermic amount at the exothermic peak top P1t in curing of the binder resin and a temperature range of an endothermic peak P2 part in melting of the solder, which shows an endothermic amount equal to or more than 1/10 of an endothermic amount at the endothermic peak top P2t in melting of the solder. Preferably, there is not an overlap between a temperature range of an exothermic peak P1 part in curing of the binder resin, which shows an exothermic amount equal to or more than 1/5 of an exothermic amount at the exothermic peak top P1t in curing of the binder resin and a temperature range of an endothermic peak P2 part in melting of the solder, which shows an endothermic amount equal to or more than 1/5 of an endothermic amount at the endothermic peak top P2t in melting of the solder. In these cases, timing for the binder resin to melt can be made moderately close to timing for the solder to melt during heating in the connection structure. As a result, the connection resistance in the connection structure further effectively decreases, and connection reliability in the connection structure under a high temperature and high humidity is still further enhanced.

For measurement of the exothermic peak P1 and the endothermic peak P2, a differential scanning calorimeter is used. Examples of the differential scanning calorimeter include "Q2000" manufactured by TA Instruments Inc. Measurement conditions include heating at a temperature rising rate of 10° C./minute from room temperature (25° C.) to a temperature at which the solder is sufficiently melted (e.g. a melting start temperature+50° C.).

A conductive material may be used in the differential scanning calorimetry. However, when the exothermic peak P1 of the binder resin and the endothermic peak P2 in melting of the solder overlap each other, and so on, the exothermic peak P1 in curing of the binder resin may be measured by using a binder resin, which is a component other than the conductive particle in the conductive material, and the endothermic peak P2 in melting of the solder may be measured by using the conductive particle or a solder in the conductive particle. Preferably, the exothermic peak P1 in curing of the binder resin and the endothermic peak P2 in melting of the solder are measured separately.

The conductive material according to the present invention may be a conductive material capable of being cured by both irradiation of light and heating. In this case, the conductive material can be semi-cured (made in stage B) to reduce fluidity of the conductive material, followed by curing the conductive material by heating. Two thermal curing agents different in reaction temperature may also be used. When two thermal curing agents different in reaction temperature are used, the conductive material can be semi-cured (preliminarily cured) by heating, and further the conductive material semi-cured by heating can be primarily cured. In the present invention, the conductive material may be cured in two stages. When the conductive material is cured in two stages, 1) heating for promoting preliminary curing in the first stage may be performed and interrupted, followed by heating for promoting curing in the second stage, or 2) heating for promoting preliminary curing in the first stage and heating for promoting curing in the second stage may be performed in succession, or 3) preliminary curing in the first stage and curing in the second stage may be performed by heating at a predetermined temperature, and then by increasing the temperature of an unheated member. When the conductive material is preliminarily cured and the primarily cured, not the exothermic peak top temperature in preliminary curing of the binder resin but the exothermic peak top P1t temperature in curing of the binder resin is set lower than the endothermic peak top P2t temperature in melting of the solder.

First, components contained or preferably contained in the conductive material according to the present invention will be described below.

[Conductive Particle]

The conductive particle may be a solder particle, or may be a conductive particle including a base material particle and a solder layer arranged on the surface of the base material particle. The solder particle does not have a base material particle at a core, and is not a core-shell particle. The solder particle is formed by a solder at both the central part and the outer surface.

Preferably, the conductive particle includes a base material particle and a solder layer arranged on the surface of the base material particle. The conductive particle may include a conductive layer other than the solder layer between the base material particle and the solder layer. The solder layer may be arranged on the surface of the base material particle with a conductive layer other than the solder layer interposed therebetween. The solder layer may be arranged on the surface of a conductive layer other than the solder layer. For further enhancing thermal shock resistant characteristics in the connection structure, the base material particle is preferably a resin particle. The base material particle is preferably a metallic particle having a melting point of 400° C. or higher or a resin particle having a softening point of 260° C. or higher. The softening point of the resin particle is preferably higher than the softening point of the solder layer, and preferably higher than the softening point of the solder layer by 10° C. or more.

Examples of the base material particle include resin particles, inorganic particles other than metallic particles, organic/inorganic hybrid particles and metallic particles. The base material particle may be a core-shell particle. The base material particle is preferably a resin particle or an organic/inorganic hybrid particle, and more preferably a resin particle. The resin particle is formed by a resin. The base material particle may be a metallic particle having a melting point of lower than 400° C., or may be a metallic particle having a melting point of 400° C. or higher, or may be a resin particle having a softening point of lower than 260° C., or may be a resin particle having a softening point of 260° C. or higher.

Figure 2:
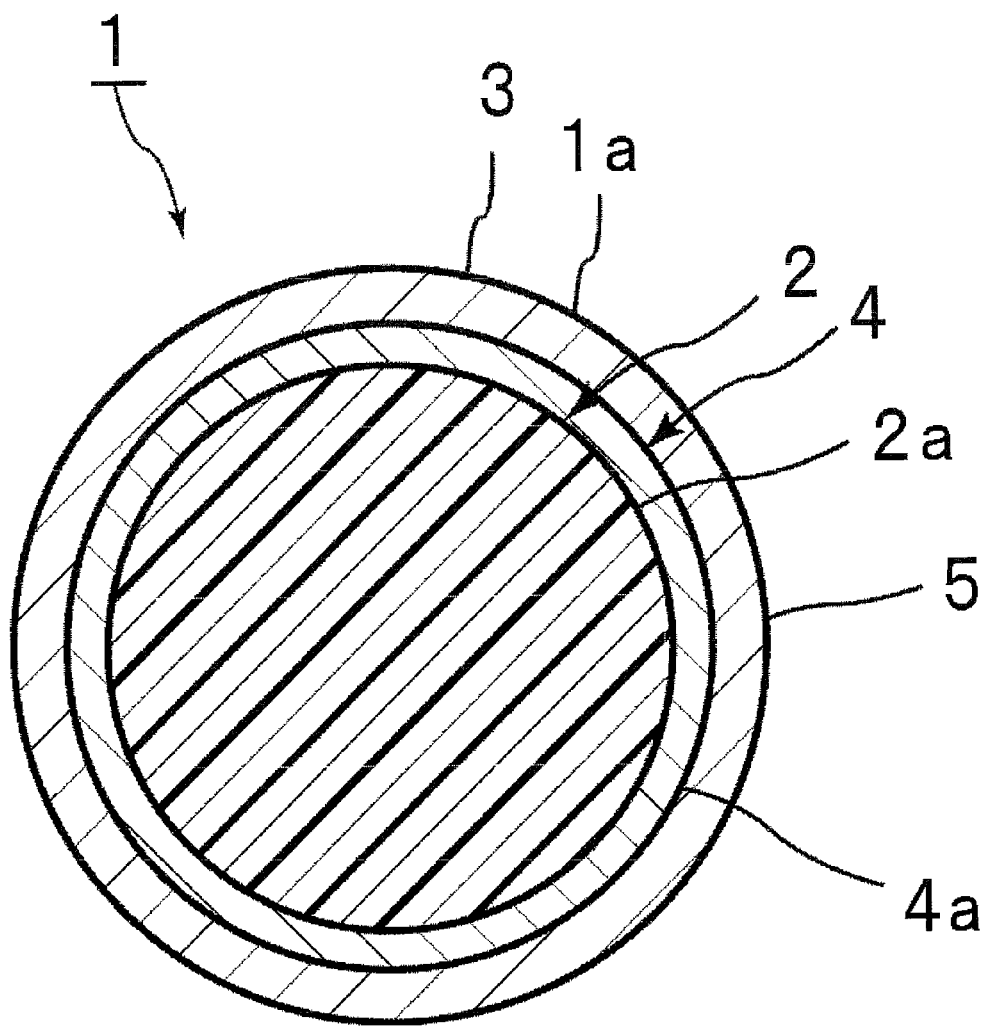
FIG. 2 is a sectional view schematically showing a conductive particle which can be used for a conductive material according to one embodiment of the present invention.

A conductive particle which can be used for a conductive material according to one embodiment of the present invention is shown in FIG. 2 as a sectional view.

A conductive particle 1 shown in FIG. 2 includes a resin particle 2 (base material particle) and a conductive layer 3 arranged on a surface 2a of the resin particle 2. The conductive layer 3 covers the surface 2a of the resin particle 2. The conductive particle 1 is a coated particle having the surface 2a of the resin particle 2 coated with the conductive layer 3. Therefore, the conductive particle 1 has the conductive layer 3 at a surface 1a. A metallic particle or the like may be used in place of the resin particle 2.

The conductive layer 3 includes a first conductive layer 4 arranged on the surface 2a of the resin particle 2, and a solder layer 5 (solder, second conductive layer) arranged on a surface 4a of the first conductive layer 4. The outer surface layer of the conductive layer 3 is the solder layer 5. Therefore, the conductive particle 1 has the solder layer 5 as a part of the conductive layer 3, and further has the first conductive layer 4 as apart of the conductive layer 3 apart from the solder layer 5 between the resin particle 2 and the solder layer 5. Thus, the conductive layer 3 may have a multilayer structure or may have a laminated structure of two or more layers.

Figure 3:
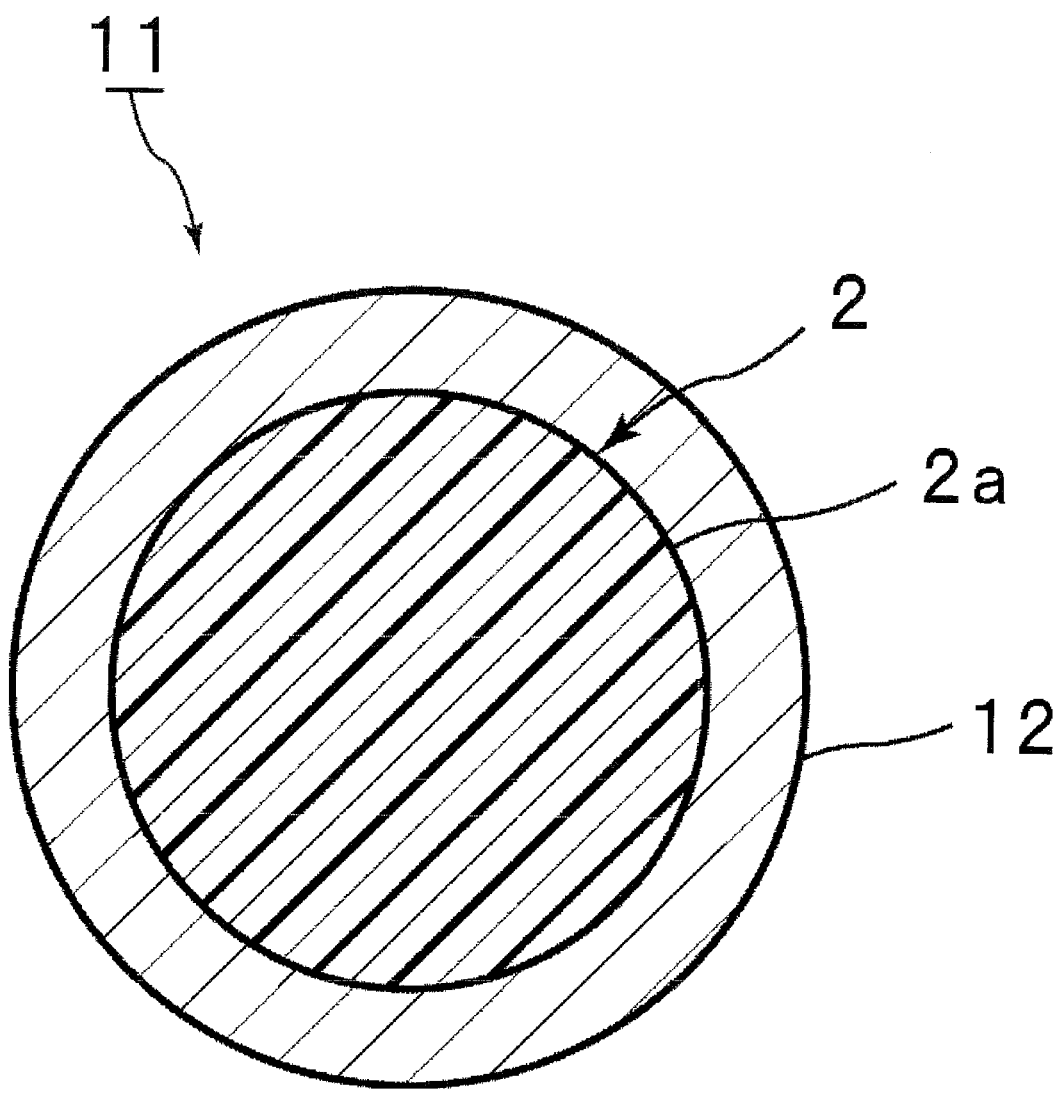
FIG. 3 is a sectional view showing a variation of a conductive particle.
Figure 4:
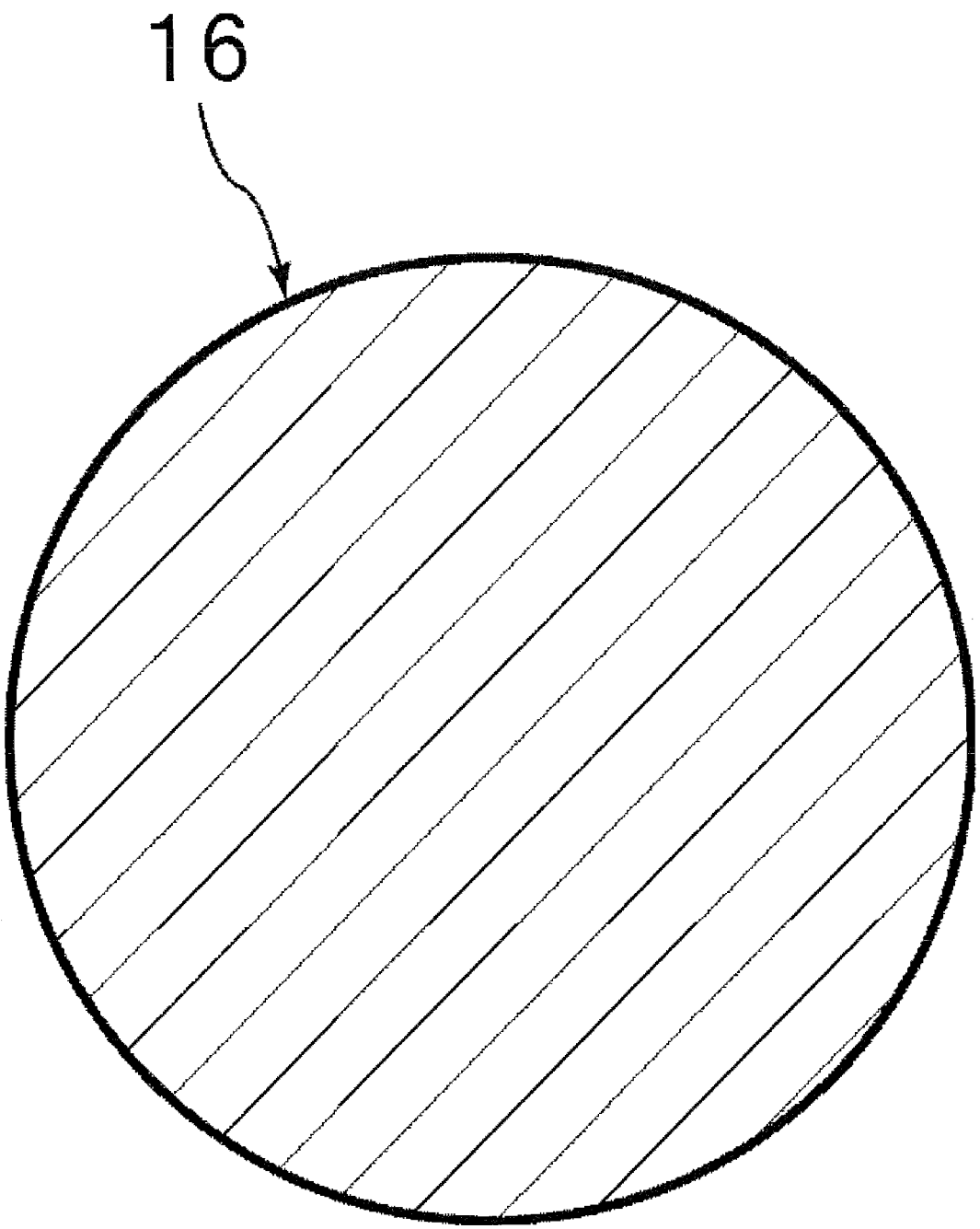
FIG. 4 is a sectional view showing another variation of a conductive particle.

As described above, the conductive layer 3 has a two-layer structure. Like a variation shown in FIG. 3, a conductive particle 11 may have a solder layer 12 as a single-layer conductive layer. At least the outer surface layer (surface) of the conductive layer in the conductive particle should be a solder layer (solder). However, among the conductive particle 1 and the conductive particle 11, the conductive particle 1 is preferred because preparation of a conductive particle is easy. Like a variation shown in FIG. 4, a conductive particle 16 that is a solder particle, which does not have a base material particle at a core and is not a core-shell particle, may be used.

The conductive particles 1, 11 and 16 can be used for the conductive material according to the present invention.

Examples of the resin for forming the resin particle described above include polyolefin resins, acrylic resins, phenol resins, melamine resins, benzoguanamine resins, urea resins, epoxy resins, unsaturated polyester resins, saturated polyester resins, polyethylene terephthalate, polysulfone, polyphenylene oxide, polyacetal, polyimide, polyamide imide, polyether ether ketone, polyether sulfone, divinylbenzene polymers and divinylbenzene-based copolymers. Examples of the divinylbenzene-based copolymer include divinylbenzene-styrene copolymers and divinylbenzene-(meth)acrylic acid ester copolymers. The resin for forming the resin particle described above is preferably a polymer obtained by polymerizing one or more polymerizable monomers having an ethylenically unsaturated group because the hardness of the resin particle can be easily controlled to a preferred range.

The method for forming a conductive layer on the surface of the base material particle (resin particle, etc.) and the method for forming a solder layer on the surface of the base material particle (resin particle, etc.) or on the surface of the first conductive layer are not particularly limited. Examples of the method for forming the conductive layer and the solder layer include a method by electroless plating, a method by electroplating, a method by physical collision, a method by a mechanochemical reaction, a method by physical vapor deposition or physical adsorption, and a method in which the surface of a base material particle is coated with a paste containing a metallic powder or a metallic powder and a binder. Particularly, a method by electroless plating, electroplating or physical collision is preferred. Examples of the method by physical vapor deposition include methods of vacuum deposition, ion plating, ion sputtering and the like. In the method by physical collision, for example, Theta Composer (manufacture by TOKUJU Co., LTD) or the like is used.

The method for forming the solder layer is preferably a method by physical collision. Preferably, the solder layer is arranged on the surface of the base material particle by physical impacts.

The material for forming the solder (solder layer) is preferably a filler material having a liquidus line of 450° C. or lower in accordance with JIS Z3001: Welding Terminology. Examples of the composition of the solder include metallic compositions including zinc, gold, silver, lead, copper, tin, bismuth and indium. Particularly, tin-indium-based (eutectic 117° C.) solder or tin-bismuth-based (eutectic 139° C.)-based solder of a low-melting and lead-free is preferred. That is, preferably the solder does not contain lead, and is preferably a solder containing tin and indium or a solder containing tin and bismuth.

The content of tin in 100% by weight of the solder (solder layer) is preferably less than 90% by weight, more preferably 85% by weight or less. The content of tin in 100% by weight of the solder is appropriately determined in consideration of the melting point of the solder and so on. The content of tin in 100% by weight of the solder is preferably 5% by weight or more, more preferably 10% by weight or more, further preferably 20% by weight or more.

The thickness of each of the first conductive layer and the solder layer is preferably 0.5 µm or more, more preferably 1 µm or more, further preferably 2 µm or more, and preferably 20 µm or less, more preferably 10 µm or less, further preferably 6 µm or less. When the thickness of each of the first conductive layer and the solder layer is equal to or larger than the above-mentioned lower limit, conductivity becomes sufficiently high. When the thickness of each of the first conductive layer and the solder layer is equal to or smaller than the above-mentioned upper limit, a difference in thermal expansion coefficient between the base material particle and the first conductive layer and solder layer becomes small, so that peeling of the first conductive layer and solder layer is hard to occur.

The average particle diameter of the conductive particles is preferably 0.1 µm or more, more preferably 1 µm or more, and preferably 500 µm or less, more preferably 100 µm or less, further preferably 80 µm or less, especially preferably 50 µm or less, most preferably 40 µm or less. When the average particle diameter of the conductive particles is equal to or larger than the above-mentioned lower limit and is equal to or smaller than the above-mentioned upper limit, the contact area of the conductive particle and the electrode becomes sufficiently large, and aggregated conductive particles are hard to be formed in formation of the conductive layer. The gap between electrodes connected through the conductive particles does not become excessively large, and the conductive layer is hard to be peeled off from the surface of the base material particle.

The average particle diameter of the conductive particles is preferably 0.1 µm or more, and more preferably 100 µm or less, further preferably 50 µm or less because the size is suitable for conductive particles in the conductive material, and the gap between electrodes becomes further small.

The "average particle diameter" of the conductive particles shows a number average particle diameter. The average particle diameter of conductive particles is determined by observing arbitrary 50 conductive particles with an electron microscope or an optical microscope, and calculating an average value.

The resin particles in the conductive particles can be used properly depending on an electrode size or land diameter of a board to be mounted.

For further reliably connecting upper and lower electrodes and further suppressing a shortcircuit between electrodes adjacent in a lateral direction, an average particle diameter C of conductive particles to an average particle diameter A of resin particles (C/A) is more than 1.0 and preferably 3.0 or less. When the first conductive layer exists between the resin particle and the solder layer, an average particle diameter B of conductive particle parts excluding solder layers to an average particle diameter A of resin particles (B/A) is more than 1.0 and preferably 2.0 or less. Further, when the first conductive layer exists between the resin particle and the solder layer, the average particle diameter C of conductive particles including solder layers to the average particle diameter B excluding solder layers (C/B) is more than 1.0 and preferably 2.5 or less. When the ratio (B/A) is falls within the above-mentioned range and the ratio (C/B) falls within the above-mentioned range, upper and lower electrodes are more reliably connected, and a shortcircuit between electrodes adjacent in a lateral direction is further suppressed.

Conductive Material for FOB and FOF Applications:

The conductive material according to the present invention is suitably used for connection of a flexible printed circuit board and a glass epoxy board (FOB (Film on Board)) or connection of a flexible printed circuit board and a flexible printed circuit board (FOF (Film on Film)).

In FOB and FOF applications, L&S, which is a dimension of a part where an electrode is present (line) and a part where an electrode is absent (space), is generally 100 to 500 μm. The average particle diameter of resin particles to be used for FOB and FOF applications is preferably 3 to 100 μm. When the average particle diameter of resin particles is 3 μm or more, the thickness of a conductive material arranged between electrodes and a connection part becomes sufficiently large, so that adhesive strength is further enhanced. When the average particle diameter of resin particles is 100 μm or less, a shortcircuit is further hard to occur between adjacent electrodes.

Conductive Material for Flip Chip Applications:

The conductive material according to the present invention is suitably used for flip chip applications.

In flip chip applications, the land diameter is generally 15 to 80 μm. The average particle diameter of resin particles to be used for flip chip applications is preferably 1 to 15 μm. When the average particle diameter of resin particles is 1 μm or more, the thickness of the solder layer arranged on the surface of the resin particle can be made sufficiently large, so that electrodes can be electrically connected further reliably. When the average particle diameter of resin particles is 15 μm or less, a shortcircuit is further hard to occur between adjacent electrodes.

Conductive Material for COF:

The conductive material according to the present invention is suitably used for connection of a semiconductor chip and a flexible printed circuit board (COF (Chip on Film)).

In COF applications, L&S, which is a dimension of a part where an electrode is present (line) and a part where an electrode is absent (space), is generally 10 to 50 μm. The average particle diameter of resin particles to be used for COF applications is preferably 1 to 10 μm. When the average particle diameter of resin particles is 1 μm or more, the thickness of the solder layer arranged on the surface of the resin particle can be made sufficiently large, so that electrodes can be electrically connected further reliably. When the average particle diameter of resin particles is 10 μm or less, a shortcircuit is further hard to occur between adjacent electrodes.

The surfaces of the conductive particles may be subjected to insulation-treatment with an insulating material, insulating particles, a flux and the like. Preferably, the insulating material, insulating particles, flux and the like are softened and fluidized by heat during connection to be eliminated from the connection part. Thus, a shortcircuit between electrodes is suppressed.

The content of the conductive particles in 100% by weight of the conductive material is preferably 1% by weight or more, more preferably 2% by weight or more, further preferably 10% by weight or more, and preferably 50% by weight or less, more preferably 45% by weight or less. When the content of the conductive particles is equal to or larger than the above-mentioned lower limit and is equal to or smaller than the above-mentioned upper limit, the conductive particles can be easily arranged between upper and lower electrodes to be connected. Further, adjacent electrodes that must not be connected are hard to be electrically connected through a plurality of conductive particles. That is, a shortcircuit between adjacent electrodes can be further suppressed.

[Binder Resin]

The binder resin includes a curable compound capable of being cured by heating, and a thermal curing agent.

The curable compound capable of being cured by heating may be a curable compound which is not cured by irradiation of light (thermosetting compound), or may be a curable compound capable of being cured by both irradiation of light and heating (photocurable and thermosetting compound).

Preferably, the conductive material is a conductive material capable of being cured by both irradiation of light and heating, and further includes a curable compound capable of being cured by irradiation of light (photocurable compound or photocurable and thermosetting compound) as the binder resin. The curable compound capable of being cured by irradiation of light may be a curable compound which is not cured by heating (photocurable compound), or may be a curable compound capable of being cured by both irradiation of light and heating (photocurable and thermosetting compound). Preferably, the conductive material according to the present invention includes a photocuring initiator. Preferably, the conductive material according to the present invention includes a photoradical generator as the photocuring initiator. Preferably, the conductive material includes a thermosetting compound and further includes a photocurable compound or a photocurable and thermosetting compound as the curable compound. Preferably, the conductive material includes a thermosetting compound and a photocurable compound as the curable compound.

Preferably, the conductive material includes two or more thermal curing agents different in reaction initiation temperature. A thermal curing agent having a reaction initiation temperature at a low-temperature side is preferably a thermal radical generator. A thermal curing agent having a reaction initiation temperature at a high-temperature side is preferably a thermal cation generator. Preferably, the exothermic peak top temperature in the binder resin is based on curing by the thermal cation generator.

The curable compound is not particularly limited, and examples thereof include curable compounds having an unsaturated double bond and curable compounds having an epoxy group or a thiirane group.

For enhancing curability of the conductive material and further enhancing conduction reliability between electrodes, the curable compound preferably includes a curable compound having an unsaturated double bond, and preferably includes a curable compound having a (meth)acryloyl group. The unsaturated double bond is preferably a (meth)acryloyl group. Examples of the curable compound having an unsaturated double bond include curable compound having no epoxy group or no thiirane group but having an unsaturated double bond, and curable compounds having an epoxy group or thiirane group and having an unsaturated double bond.

As the curable compound having the (meth)acryloyl group, an ester compound obtained by reacting a (meth)acrylic acid with a compound having a hydroxyl group, an epoxy (meth)acrylate obtained by reacting a (meth)acrylic acid with an epoxy compound, an urethane (meth)acrylate obtained by reacting an isocyanate with a (meth)acrylic acid derivative having a hydroxyl group, or the like is suitably used. The "(meth)acryloyl group" shows an acryloyl group and a methacryloyl group. The "(meth)acrylic" shows an acrylic and a methacrylic. The "(meth)acrylate" shows an acrylate and a methacrylate.

The ester compound obtained by reacting a (meth)acrylic acid with a compound having a hydroxyl group is not particularly limited. As the ester compound, any of a monofunctional ester compound, a difunctional ester compound and tri- and higher functional ester compounds can be used.

For enhancing curability of the conductive material, further enhancing conduction reliability between electrodes and further enhancing adhesive strength of the cured product, the conductive material preferably includes a curable compound having both an unsaturated double bond and a thermosetting functional group. Examples of the thermosetting functional group include an epoxy group, a thiirane group and an oxetanyl group. The curable compound having both an unsaturated double bond and a thermosetting functional group is preferably a curable compound having an epoxy group or a thiirane group and an unsaturated double bond, preferably a curable compound having both a thermosetting functional group and a (meth)acryloyl group, and preferably a curable compound having an epoxy group or a thiirane group and a (meth) acryloyl group.

The curable compound having an epoxy group or a thiirane group and a (meth)acryloyl group is preferably a curable compound obtained by converting some epoxy groups or some thiirane groups of a curable compound having two or more epoxy groups or two or more thiirane groups into (meth) acryloyl groups. Such a curable compound is a partially (meth)acrylated epoxy compound or a partially (meth)acrylated episulfide compound.

The curable compound is preferably a reaction product of a compound having two or more epoxy groups or two or more thiirane groups and a (meth)acrylic acid. This reaction product is obtained by reacting a compound having two or more epoxy groups or two or more thiirane groups with a (meth) acrylic acid in the presence of a catalyst (such as a basic catalyst) in accordance with a usual method. Preferably, 20% or more of epoxy groups or thiirane groups is converted into (meth)acryloyl groups (conversion ratio). The conversion ratio is more preferably 30% or more and preferably 80% or less, more preferably 70% or less. Most preferably, 40% or more and 60% or less of epoxy groups or thiirane groups are converted into (meth)acryloyl groups.

Examples of the partially (meth)acrylated epoxy compound include bisphenol type epoxy (meth)acrylates, cresol novolac type epoxy (meth)acrylates, carboxylic acid anhydride-modified epoxy (meth)acrylates and phenol novolac type epoxy (meth)acrylates.

As the curable compound, a modified phenoxy resin formed by converting some epoxy groups or some thiirane groups of a phenoxy resin having two or more epoxy groups or two or more thiirane groups into (meth)acryloyl groups may be used. That is, a modified phenoxy resin having an epoxy group or a thiirane group and a (meth)acryloyl group may be used.

Generally, the "phenoxy resin" is a resin obtained by reacting, for example, epihalohydrin and a divalent phenol compound, or a resin obtained by reacting a divalent epoxy compound and a divalent phenol compound.

The curable compound may be a crosslinkable compound or may be a non-crosslinkable compound.

Specific examples of the crosslinkable compound include 1,4-butanediol di(meth)acrylate, 1,6-hexanediol di(meth) acrylate, 1,9-nonanediol di(meth)acrylate, (poly)ethylene glycol di(meth)acrylate, (poly)propylene glycol di(meth) acrylate, neopentylglycol di(meth)acrylate, pentaerythritol di(meth)acrylate, glycerin methacrylate-acrylate, pentaerythritol tri(meth)acrylate, trimethylolpropane trimethacrylate, allyl (meth)acrylate, vinyl (meth)acrylate, divinylbenzene, polyester (meth)acrylate and urethane (meth)acrylate.

Specific examples of the non-crosslinkable compound include ethyl (meth)acrylate, n-propyl (meth)acrylate, isopropyl (meth)acrylate, n-butyl (meth)acrylate, isobutyl (meth)acrylate, t-butyl (meth)acrylate, pentyl (meth)acrylate, hexyl (meth)acrylate, heptyl (meth)acrylate, 2-ethylhexyl (meth)acrylate, n-octyl (meth)acrylate, isooctyl (meth)acrylate, nonyl (meth)acrylate, decyl (meth)acrylate, undecyl (meth)acrylate, dodecyl (meth)acrylate, tridecyl (meth)acrylate and tetradecyl (meth)acrylate.

Further, examples of the curable compound include oxetane compounds, epoxy compounds, episulfide compounds, (meth)acryl compounds, phenol compounds, amino compounds, unsaturated polyester compounds, polyurethane compounds, silicone compounds and polyimide compounds.

For easily controlling curing of the conductive material and further enhancing conduction reliability in the connection structure, the curable compound preferably includes a curable compound having an epoxy group or a thiirane group. The curable compound having an epoxy group is an epoxy compound. The curable compound having a thiirane group is an episulfide compound. For enhancing curability of the conductive material, the content of the compound having an epoxy group or a thiirane group, in 100% by weight of the curable compound, is preferably 10% by weight or more, more preferably 20% by weight or more, and 100% by weight or less. The curable compound having an epoxy group or a thiirane group may constitute the total amount of the above-described curable compound. For improving handling characteristics and further enhancing conduction reliability in the connection structure, the compound having an epoxy group or a thiirane group is preferably an epoxy compound.

Preferably, the conductive material according to the present invention includes a curable compound having an epoxy group or a thiirane group and a curable compound having an unsaturated double bond.

Preferably, the curable compound having an epoxy group or a thiirane group has an aromatic ring. Examples of the aromatic ring include a benzene ring, a naphthalene ring, an anthracene ring, a phenanthrene ring, a tetracene ring, a chrysene ring, a triphenylene ring, a tetraphene ring, a pyrene ring, a pentacene ring, a picene ring and a perylene ring. Particularly, the aromatic ring is preferably a benzene ring, a naphthalene ring or an anthracene ring, and more preferably a benzene ring or a naphthalene ring. The naphthalene ring is preferred because it has a planar structure, so that the conductive material can be further quickly cured.

When a thermosetting compound and a photocurable compound are used in combination, the compounding ratio of the photocurable compound and the thermosetting compound is appropriately adjusted according to types of the photocurable compound and the thermosetting compound. The conductive material includes the photocurable compound and the thermosetting compound at a weight ratio of preferably 1:99 to 90:10, more preferably 5:95 to 60:40, further preferably 10:90 to 40:60.

The conductive material includes a thermal curing agent. The thermal curing agent cures the curable compound capable of being cured by heating. As the thermal curing agent, previously known thermal curing agents can be used. The thermal curing agents may be used alone, or used in combination of two or more thereof.

Examples of the thermal curing agent include imidazole curing agents, amine curing agents, phenol curing agents, polythiol curing agents, thermal cation generators, acid anhydrides and thermal radical generators. Particularly, imidazole curing agents, polythiol curing agents or amine curing agents are preferred because the conductive material can be further quickly cured at low temperature. Latent curing agents are preferred because storage stability is enhanced when a curable compound capable of being cured by heating and the thermal curing agent are mixed. The latent curing agents are preferably latent imidazole curing agents, latent polythiol curing agents or latent amine curing agents. These thermal curing agents may be used alone, or used in combination of two or more thereof. The thermal curing agent may be coated with a polymer substance such as a polyurethane resin or a polyester resin.

The imidazole curing agent is not particularly limited, and examples thereof include 2-methylimidazole, 2-ethyl-4-methylimidazole, 1-cyanoethyl-2-phenylimidazole, 1-cyanoethyl-2-phenylimidazolium trimellitate, 2,4-diamino-6-[2'-methylimidazolyl-(1')]-ethyl-s-triazine and 2,4-diamino-6-[2'-methylimidazolyl-(1')]-ethyl-s-triazineis ocyanuric acid adducts.

The polythiol curing agent is not particularly limited, and examples thereof include trimethylolpropane tris-3-mercaptopropionate, pentaerythritol tetrakis-3-mercaptopropionate and dipentaerythritol hexa-3-mercaptopropionate.

The amine curing agent is not particularly limited, and examples thereof include hexamethylenediamine, octamethylenediamine, decamethylenediamine, 3,9-bis(3-aminopropyl)-2,4,8,10-tetraspiro[5.5]undecane, bis(4-aminocyclohexyl)methane, methaphenylenediamine and diaminodiphenyl sulfone.

Examples of the thermal cation generator include iodonium-based cationic curing agents, oxonium-based cationic curing agents and sulfonium-based cationic curing agents. Examples of the iodonium-based cationic curing agent include bis(4-tert-butylphenyl)iodonium hexafluorophosphate. Examples of the oxonium-based cationic curing agent include trimethyloxonium tetrafluoroborate. Examples of the sulfonium-based cationic curing agent include tri-p-tolylsulfonium hexafluorophosphate.

For removing an oxide film formed on the solder surface or the electrode surface to make it easy to form a metal joint with upper and lower electrodes, and connection reliability is further enhanced, the thermal curing agent preferably includes a thermal cation generator.

The content of the thermal curing agent is not particularly limited. The content of the thermal curing agent is preferably 0.01 part by weight or more, more preferably 1 part by weight or more, and preferably 200 parts by weight or less, more preferably 100 parts by weight or less, further preferably 75 parts by weight or less based on 100 parts by weight of the curable compound capable of being cured by heating. When the content of the thermal curing agent is equal to or larger than the above-mentioned lower limit, the conductive material is easily cured sufficiently. When the content of the thermal curing agent is equal to or smaller than the above-mentioned upper limit, an excessive thermal curing agent which has not been involved in curing is hard to remain after curing, and heat resistance of the cured product is further enhanced.

When the thermal curing agent includes a thermal cation generator, the content of the thermal cation generator is preferably 0.01 part by weight or more, more preferably 0.05 parts by weight or more, and preferably 10 parts by weight or less, more preferably 5 parts by weight or less based on 100 parts by weight of the curable compound capable of being cured by heating. When the content of the thermal cation generator is equal to or larger than the above-mentioned lower limit and is equal to or smaller than the above-mentioned upper limit, the conductive material (curable composition) is thermally cured sufficiently.

Preferably, the conductive material includes a photocuring initiator. The photocuring initiator is not particularly limited. As the photocuring initiator, previously known photocuring initiators can be used. For further enhancing conduction reliability between electrodes and connection reliability of the connection structure, the conductive material preferably includes a photoradical generator. The photocuring initiators may be used alone, or used in combination of two or more thereof.

The photocuring initiator is not particularly limited, and examples thereof include acetophenone photocuring initiators (acetophenone photoradical generators), benzophenone photocuring initiators (benzophenone photoradical generators), thioxanthone, ketal photocuring initiators (ketal photoradical generators), halogenated ketone, acylphosphinoxide and acylphosphonate.

Specific examples of the acetophenone photocuring initiator include 4-(2-hydroxyethoxy)phenyl(2-hydroxy-2-propyl)ketone, 2-hydroxy-2-methyl-1-phenylpropane-1-one, methoxyacetophenone, 2,2-dimethoxy-1,2-diphenylethane-1-one and 2-hydroxy-2-cyclohexylacetophenone. Specific examples of the ketal photocuring initiator include benzyl dimethyl ketal.

The content of the photocuring initiator is not particularly limited. The content of the photocuring initiator (content of photoradical generator when the photocuring initiator is a photoradical generator) is preferably 0.1 part by weight or more, more preferably 0.2 parts by weight or more, and preferably 2 parts by weight or less, more preferably 1 part by weight or less based on 100 parts by weight of the curable compound capable of being cured by irradiation of light. When the content of the photocuring initiator is equal to or larger than the above-mentioned lower limit and is equal to or smaller than the above-mentioned upper limit, the conductive material can be moderately photo-cured. By irradiating the conductive material with light to be made in B stage, fluidization of the conductive material can be suppressed.

Preferably, the conductive material includes a thermal radical generator. The thermal radical generator is not particularly limited. As the thermal radical generator, previously known thermal radical generators can be used. When the thermal radical generator is used, conduction reliability between electrodes and connection reliability of the connection structure are further enhanced. The thermal radical generators may be used alone, or used in combination of two or more thereof.

The thermal radical generator is not particularly limited, and examples thereof include azo compounds and organic peroxides. Examples of the azo compound include azobisisobutyronitrile (AIBN). Examples of the organic peroxide include di-tert-butyl peroxide and methyl ethyl ketone peroxide.

The content of the thermal radical generator is preferably 0.1 part by weight or more, more preferably 0.2 parts by weight or more, and preferably 5 parts by weight or less, more preferably 3 parts by weight or less based on 100 parts by weight of the curable compound capable of being cured by heating. When the content of the thermal radical generator is equal to or larger than the above-mentioned lower limit and is equal to or smaller than the above-mentioned upper limit, the conductive material can be thermally cured moderately. By making the conductive material in B stage, fluidization of the conductive material can be suppressed, and occurrence of voids during joining can be also suppressed.

Preferably, the conductive material according to the present invention includes a flux. When the flux is used, the exothermic peak of the binder resin can be appropriately adjusted. By using the flux, an oxide film is hard to be formed on the solder surface, and an oxide film formed on the solder surface or the electrode surface can be effectively removed. As a result, conduction reliability in the connection structure is further enhanced. The conductive material may not necessarily include a flux.

The flux is not particularly limited. As the flux, fluxes that are generally used for solder joint can be used. Examples of the flux include zinc chloride, mixtures of zinc chloride and an inorganic halide, mixtures of zinc chloride and an inorganic acid, molten salts, phosphoric acid, derivatives of phosphoric acid, organic halides, hydrazine, organic acids and pine resins. The fluxes may be used alone, or used in combination of two or more thereof.

Examples of the molten salt include ammonium chloride. Examples of the organic acid include lactic acid, citric acid, stearic acid and glutamic acid. Examples of the pine resin include an activated pine resin and a non-activated pine resin. The flux is preferably a pine resin. When the pine resin is used, the connection resistance between electrodes further decreases. The flux is preferably an organic acid having a carboxyl group. Examples of the compound having a carboxyl group include compounds with a carboxyl group bound to an alkyl chain, and compounds with a carboxyl group bound to an aromatic ring. In these compounds having a carboxyl group, a hydroxyl group may be further bound to an alkyl chain or an aromatic ring. The number of carboxyl groups bound to an alkyl chain or an aromatic ring is preferably 1 to 3, more preferably 1 or 2. The number of carbon atoms in the compound with a carboxyl group bound to an alkyl chain is preferably 3 or more, and preferably 8 or less, more preferably 6 or less. Specific examples of the compound with a carboxyl group bound to an alkyl chain include hexanoic acid (5 carbon atoms and 1 carboxyl group) and glutaric acid (4 carbon atoms and 2 carboxyl groups). Specific examples of the compound having a carboxyl group and a hydroxyl group include malic acid and citric acid. Specific examples of the compound with a carboxyl group bound to an aromatic ring include benzoic acid, phthalic acid, benzoic anhydride and phthalic anhydride.

The pine resin is a rosin having abietic acid as a main component. The flux is preferably a rosin, and more preferably abietic acid. When this preferable flux is used, the connection resistance between electrodes further decreases.

The flux may be dispersed in the binder resin, or may be deposited on the surface of the conductive particle.

The content of the flux in 100% by weight of the conductive material is preferably 0.5% by weight or more, preferably 30% by weight or less, and more preferably 25% by weight or less. When the content of the flux is equal to or larger than the above-mentioned lower limit and is equal to or smaller than the above-mentioned upper limit, an oxide film is further hard to be formed on the solder surface, and an oxide film formed on the solder surface or the electrode surface can be further effectively removed. In addition, when the content of the flux is equal to or larger than the above-mentioned lower limit, an effect of adding a flux is further effectively exhibited. When the content of the flux is equal to or smaller than the above-mentioned upper limit, hygroscopicity of the cured product further decreases, so that reliability of the connection structure is further enhanced.

Preferably, the conductive material includes a filler. When the filler is used, the linear thermal expansion coefficient of the cured product of the conductive material decreases. Specific examples of the filler include silica, aluminum nitride, alumina, glass, boron nitride, silicon nitride, silicone, carbon, graphite, graphene and talc. The fillers may be used alone, or used in combination of two or more thereof. When a filler having a high thermal conductivity is used, curing time becomes short.

The conductive material may include a solvent. When the solvent is used, the viscosity of the conductive material can be easily adjusted. Examples of the solvent include ethyl acetate, methylcellosolve, toluene, acetone, methyl ethyl ketone, cyclohexane, n-hexane, tetrahydrofuran and diethyl ether.

(Details and Uses of Conductive Material)

The conductive material according to the present invention is a paste-like or film-like conductive material, and is preferably a paste-like conductive material. The paste-like conductive material is a conductive paste. The film-like conductive material is a conductive film. When the conductive material is a conductive film, a film which does not contain conductive particles may be laminated on a conductive film which contains conductive particles. The conductive material according to the present invention is preferably anisotropic conductive material. Preferably, the conductive material according to the present invention is used for connection of electrodes.

The conductive material according to the present invention is preferably a conductive paste, which is applied onto a connection object member in a paste-like state.

The viscosity of the conductive paste at 25° C. is preferably 3 Pa·s or more, more preferably 5 Pa·s or more, and preferably 500 Pa·s or less, more preferably 300 Pa·s or less. When the viscosity is equal to or higher than the above-mentioned lower limit, sedimentation of conductive particles in the conductive paste can be suppressed. When the viscosity is equal to or lower than the above-mentioned upper limit, dispersibility of conductive particles is further enhanced. When the viscosity of the conductive paste before being applied falls within the above-mentioned range, fluidization of the conductive paste before curing can be further suppressed after the conductive paste is applied onto the first connection object member, and voids are further hard to occur.

The viscosity of the binder resin at the endothermic peak top P2t temperature in melting of the solder is preferably 50 Pa·s or more, more preferably 80 Pa·s or more, and preferably 800 Pa·s or less, more preferably 600 Pa·s or less. When the viscosity is equal to or higher than the above-mentioned lower limit, the solder in conductive particles is effectively and moderately spread in a wet state over the electrode surface. When the viscosity is equal to or lower than the above-mentioned upper limit, voids are hard to occur in the connection structure.

The viscosity is determined by measuring a minimum complex viscosity $\eta^*$ using a rheometer. Measurement conditions include a strain control of 1 rad, a frequency of 1 Hz, a temperature rising rate of 20° C./minute and a measurement temperature range of 60° C. to (endothermic peak top temperature in melting of the solder+50)° C.

The conductive material according to the present invention is preferably a conductive material that is used for connecting a connection object member having a copper electrode. The surface of a copper electrode is very susceptible to formation of an oxide film. However, when the conductive material according to the present invention includes a thermal cation generator or a flux, an oxide film on a copper electrode can be effectively removed, and then conduction reliability in the connection structure can be enhanced.

The conductive material according to the present invention can be used for bonding various connection object members. The conductive material is suitably used for obtaining a connection structure in which first and second connection object members are electrically connected.

Figure 5:
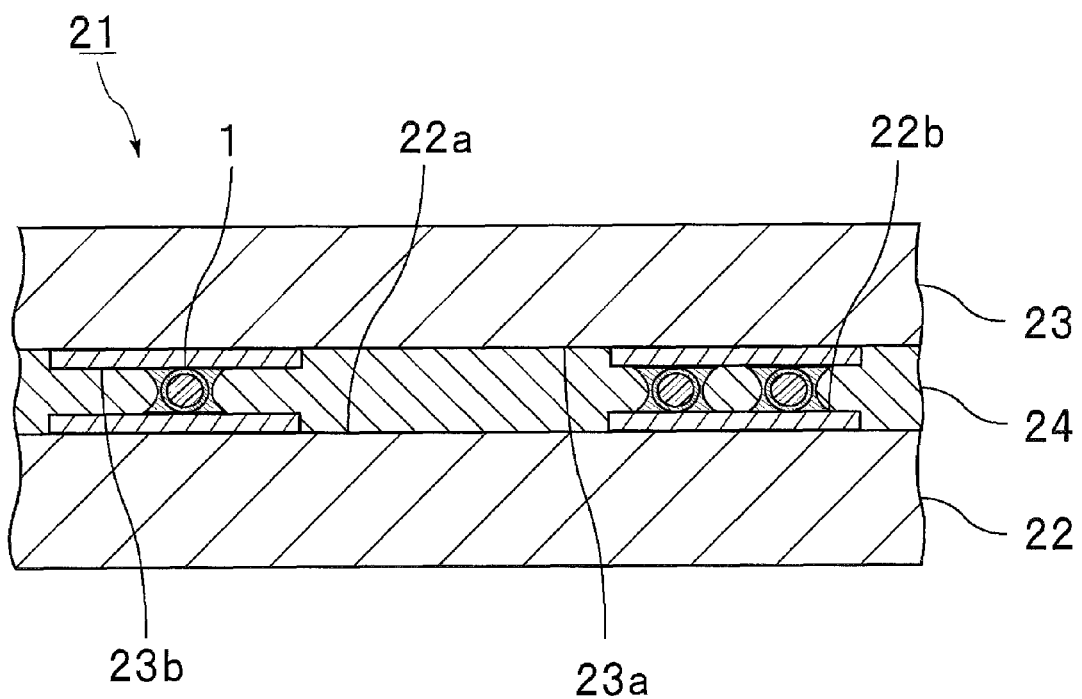
FIG. 5 is a sectional front view schematically showing a connection structure according to one embodiment of the present invention.

One example of a connection structure using a conductive material according to one embodiment of the present invention is schematically shown in FIG. 5 as a sectional view.

A connection structure 21 shown in FIG. 5 includes a first connection object member 22, a second connection object member 23, and a connection part 24 electrically connecting the first and second connection object members 22 and 23. The connection part 24 is formed by a conductive material (such as an anisotropic conductive material) including conductive particles 1. Here, conductive particles 1 are used. Other conductive particles such as conductive particles 11 and solder particles 16 may be used in place of conductive particles 1.

The first connection object member 22 has a plurality of first electrodes 22b at a surface 22a. The second connection object member 23 has a plurality of second electrodes 23b at a surface 23a. The first electrode 22b and the second electrode 23b are electrically connected by one or more conductive particles 1. Accordingly, the first and second connection object members 22 and 23 are electrically connected by conductive particles 1.

The method for producing the connection structure is not particularly limited. One example of the method for producing the connection structure is a method in which the conductive material is arranged between the first connection object member and the second object member to obtain a laminated body, followed by heating and pressurizing the laminated body. By heating and pressurization, the solder layer 5 of the conductive particle 1 is melted, and electrodes are electrically connected by the conductive particle 1. Further, since the binder resin includes a curable compound capable of being cured by heating, the binder resin is cured, and the first and second connection object members 22 and 23 are connected by the cured binder resin. The pressure of the pressurization is about $9.8 \times 10^4$ to $4.9 \times 10^6$ Pa. The temperature of the heating is about 120 to 220° C.

Figure 6:
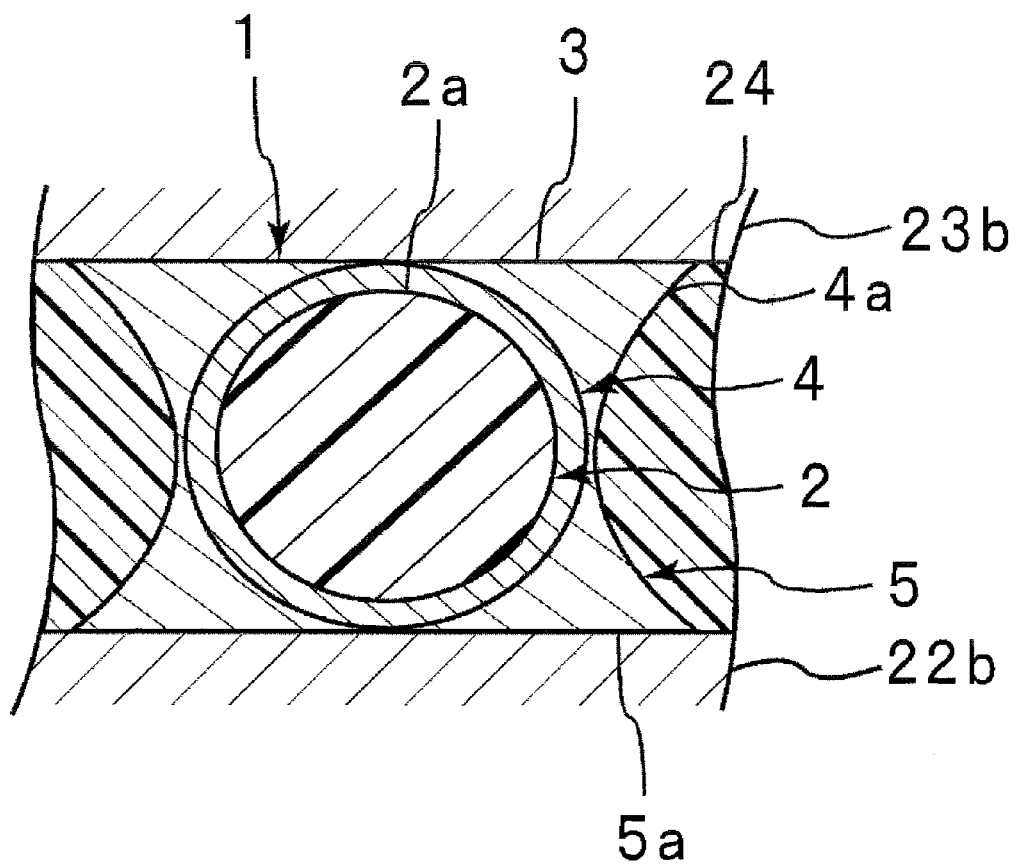
FIG. 6 is a sectional front view schematically showing in an enlarged scale a connection part between a conductive particle and an electrode in the connection structure shown in FIG. 5.

A connection part between the conductive particle 1 and the first and second electrodes 22b and 23b in the connection structure 21 shown in FIG. 5 is shown in an enlarged scale in FIG. 6 as a sectional front view. As shown in FIG. 6, in the connection structure 21, the solder layer 5 of the conductive particle 1 is melted by heating and pressurizing the laminated body, and thereafter a melted solder layer part 5a comes into contact with the first and second electrodes 22b and 23b sufficiently. That is, by using the conductive particle 1 having the solder layer 5 as a surface layer, the contact area of the conductive particle 1 and the electrodes 22b and 23b can be made larger as compared to a case where a conductive particle with the surface layer of a conductive layer formed by a metal such as nickel, gold or copper is used. Therefore, conduction reliability of the connection structure 21 can be enhanced. Generally, heating causes a flux to be gradually deactivated. Further, the first conductive layer 4 can be brought into contact with the first electrode 22b and the second electrode 23b.

The first and second connection object members are not particularly limited. Specific examples of the first and second connection object members include electronic components such as semiconductor chips, capacitors and diodes, and electronic components such as circuit boards such as a printed board, a flexible printed circuit board, a glass epoxy board and a glass board. The conductive material is preferably a conductive material that is used for connecting electronic components. The conductive material is preferably a conductive material which is liquid and is applied to the upper surface of the connection object member in a liquid state.

Examples of the electrode provided on the connection object member include metal electrodes such as a gold electrode, a nickel electrode, a tin electrode, an aluminum electrode, a copper electrode, a molybdenum electrode and a tungsten electrode. When the connection object member is a flexible printed circuit board, the electrode is preferably a gold electrode, a nickel electrode, a tin electrode or a copper electrode. When the connection object member is a glass board, the electrode is preferably an aluminum electrode, a copper electrode, a molybdenum electrode or a tungsten electrode. When the electrode is an aluminum electrode, it may be an electrode formed only of aluminum, or may be an electrode with an aluminum layer laminated on the surface of a metal oxide layer. Examples of the material of the metal oxide layer include indium oxide doped with a trivalent metal element and zinc oxide doped with a trivalent metal element. Examples of the trivalent metal element include Sn, Al and Ga.

Preferably, the first electrode or the second electrode is a copper electrode. In this case, both the first electrode and the second electrode may be copper electrodes. Preferably, both the first electrode and the second electrode are copper electrodes.

The present invention will be specifically described below by way of Examples and Comparative Examples. The present invention is not limited to Examples below.

In Examples and Comparative Examples, the following materials were used.

(Binder Resin)

Thermosetting compound 1 (epoxy group-containing acrylic resin, "Blemmer CP-30" manufactured by Mitsubishi Chemical Corporation)

Thermosetting compound 2 (bisphenol A type epoxy compound, "YL980" manufactured by Mitsubishi Chemical Corporation)

Thermosetting compound 3 (resorcinol type epoxy compound, "EX-201" manufactured by Nagase ChemteX Corporation)

Thermosetting compound 4 (epoxy resin, "EXA-4850-150" manufactured by DIC Corporation)

Thermal curing agent A (imidazole compound, "2P-4MZ" manufactured by SHIKOKU CHEMICALS CORPORATION)

The thermal cation generator 1 (compound represented by the following formula (11), compound which releases inorganic acid ions including phosphorus atoms when heated).

[Formula 1]

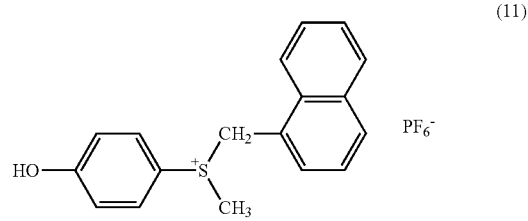

(11)

The thermal cation generator 2 (compound represented by the following formula (12), compound which releases inorganic acid ions including antimony atoms when heated).

[Formula 2]

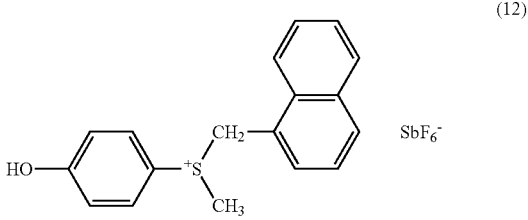

(12)

The thermal cation generator 3 (compound represented by the following formula (13), compound which releases organic acid ions including boron atoms when heated).

[Formula 3]

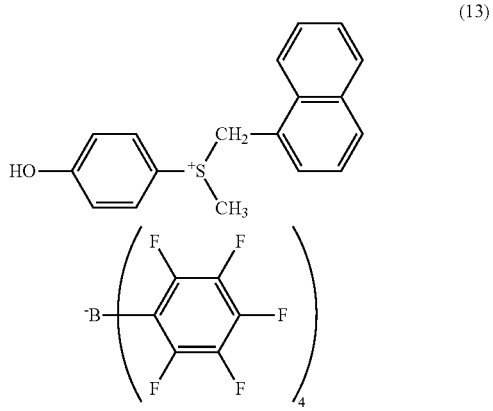

(13)

Thermal radical generator 1 (azo-based initiator, "V-70" manufactured by Wako Pure Chemical Industries, Ltd.)

Thermal radical generator 2 (azo-based initiator, "V-65" manufactured by Wako Pure Chemical Industries, Ltd.)

Adhesion imparting agent: "KBE-403" manufactured by Shin-Etsu Chemical Co., Ltd.

Flux: "Glutaric Acid" manufactured by Wako Pure Chemical Industries, Ltd.

(Conductive Particles)

Conductive particles 1 (resin core solder-coated particles, prepared in the procedure described below)

Divinylbenzene resin particles ("Micropearl SP-210" manufactured by SEKISUI CHEMICAL CO., LTD, average particle diameter: 10 μm, softening point: 330° C., 10% K value (23° C.) 3.8 GPa) were subjected to electroless nickel plating to form base nickel-plated layers each having a thickness of 0.1 μm on the surfaces of the resin particles. Then, the resin particles with base nickel-plated layers formed thereon were subjected to electrolytic copper plating to form copper layers each having a thickness of 1 μm. Further, using an electrolytic plating solution containing tin and bismuth, electrolytic plating was performed to form solder layers each having a thickness of 2 μm. In this way, conductive particles (resin core solder-plated particles having an average particle diameter of 16 μm and a CV value of 20%) was prepared in which copper layers each having a thickness of 1 μm were formed on the surfaces of resin particles and solder layers (tin:bismuth=43% by weight:57% by weight) each having a thickness of 2 μm were formed on the copper layers.

Further, conductive particles 2 and 3 described below were obtained in the same manner as that for the conductive particles 1 except that the type of the base material particle, the average particle diameter of base material particles, the thickness of the copper layer and the thickness of the solder layer were changed.

Conductive particles 2 (divinylbenzene resin particles, average particle diameter of resin particles: 10 μm, 10% K value (23° C.) of resin particles: 3.8 GPa, softening point of resin particles: 330° C., thickness of copper layer: 3 μm, thickness of solder layer: 4 μm, average particle diameter of conductive particles: 24 μm, CV value: 26%)

Conductive particles 3 (divinylbenzene resin particles, average particle diameter of resin particles: 20 μm, 10% K value (23° C.) of resin particles: 3.6 GPa, softening point of resin particles: 330° C., thickness of copper layer: 3 μm, thickness of solder layer: 4 μm, average particle diameter of conductive particles: 34 μm, CV value: 25%)

Conductive particles A: SnBi solder particles ("DS-10" manufactured by MITSUI MINING & SMELTING CO., LTD., average particle diameter (median diameter): 12 μm)

Conductive particles B: SnBi solder particles ("10-25" manufactured by MITSUI MINING & SMELTING CO., LTD., average particle diameter (median diameter): 21 μm)

Conductive particles C: SnBi solder particles ("20-30" manufactured by MITSUI MINING & SMELTING CO., LTD., average particle diameter (median diameter): 29 μm)

Examples 1 to 15 and Comparative Examples 1 to 7

Components shown in Table 1 below were compounded in compounding amounts shown in Table 1 to obtain an anisotropic conductive material (anisotropic conductive paste).

(Evaluation)

(1) Measurements of Exothermic Peak P1 and Endothermic Peak P2 by DSC

Components other than conductive particles in the anisotropic conductive material were compounded to obtain a binder resin. Using a differential scanning calorimeter ("Q2000" manufactured by TA Instruments Inc.), the obtained binder resin was heated at a temperature rising rate of 10° C./minute to measure an exothermic peak P1 in curing of the binder resin.

Further, using the differential scanning calorimeter ("Q2000" manufactured by TA Instruments Inc.), the conductive particle was heated at a temperature rising rate of 10° C./minute to measure an endothermic peak P2 in melting of the solder layer or the solder particle.

In Table 1 are shown 1) the exothermic peak top temperature P1t in curing of the binder resin, 2) the endothermic peak top temperature P2t in melting of the solder layer or the solder particle, 3) presence/absence of an overlap A between a temperature range of the exothermic peak P1 in curing of the binder resin and a temperature range of the endothermic peak P2 in melting of the solder layer or the solder particle, 4) presence/absence of an overlap B between a temperature range of an exothermic peak P1 part in curing of the binder resin, which shows an exothermic amount equal to or more than ¹⁄₁₀ of an exothermic amount at the exothermic peak top P1t in curing of the binder resin and a temperature range of an endothermic peak P2 part in melting of the solder layer or the solder particle, which shows an endothermic amount equal to or more than ¹⁄₁₀ of an endothermic amount at the endothermic peak top P2t in melting of the solder layer or the solder particle, and 5) presence/absence of an overlap C between a temperature range of an exothermic peak P1 part in curing of the binder resin, which shows an exothermic amount equal to or more than ⅕ of an exothermic amount at the exothermic peak top P1t in curing of the binder resin and a temperature range of an endothermic peak P2 part in melting of the solder layer or the solder particle, which shows an endothermic amount equal to or more than ⅕ of an endothermic amount at the endothermic peak top P2t in melting of the solder layer or the solder particle.

(2) Preparation of Connection Structure

A glass epoxy board (FR-4 board) having a copper electrode pattern (copper electrode thickness: 10 μm) of L/S: 100 μm/100 μm at the upper surface was provided. Further, a flexible printed circuit board having a copper electrode pattern (copper electrode thickness: 10 μm) of L/S: 100 μm/100 μm at the lower surface was provided.

A superimposed area of the glass epoxy board and the flexible board was 1.5 cm×4 mm, and the number of connected electrodes was 75 pairs.

The anisotropic conductive material immediately after being prepared was applied in a thickness of 50 μm to the upper surface of the glass epoxy board to form an anisotropic conductive material layer. At this time, solvent drying was performed for anisotropic conductive pastes containing a solvent. Next, the flexible printed circuit board was laminated to the upper surface of the anisotropic conductive material layer such that electrodes faced each other. Thereafter, a pressurizing and heating head was placed on the upper surface of the semiconductor chip while the temperature of the head was adjusted so that the anisotropic conductive material layer had a temperature of 185° C., and a pressure of 2.0 MPa was applied to melt the solder, the anisotropic conductive material layer was cured at 185° C., and then a connection structure was obtained.

(3) Conduction Test Between Upper and Lower Electrodes

Connection resistances between upper and lower electrodes of the obtained connection structure were each measured by a four-terminal method. An average of two connection resistances was calculated. From the relationship of voltage=current×resistance, a connection resistance can be determined by measuring a voltage at the time of passing a constant current. Assessment was performed on the conduction test in accordance with the criteria described below.

[Assessment Criteria for Conduction Test]

◯◯: The average of connection resistances is not more than 8.0Ω.

◯: The average of connection resistances is more than 8.0Ω and not more than 10.0Ω.

Δ: The average of connection resistances is more than 10.0Ω and not more than 15.0Ω.

x: The average of connection resistances is more than 15.0 Ω.

(4) Humidity/Heat Resistance

Humidity/heat resistance was evaluated by a bias test. Specifically, a glass epoxy board (FR-4 board) having a comb-shaped copper electrode pattern (copper electrode thickness: 10 μm) of L/S: 100 μm/100 μm at the upper surface was provided. Further, a flexible printed circuit board having a comb-shaped copper electrode pattern (copper electrode thickness: 10 μm) of L/S: 100 μm/100 μm at the lower surface was provided. A connection structure was obtained under the same conditions as in (1).

A superimposed area of the glass epoxy board and the flexible board was 1.5 cm×4 mm, and the number of connected electrodes was 75 pairs.

The connection structure was left standing for 500 hours at 85° C. and a relative humidity of 85%. Thereafter, assessment was performed on humidity/heat resistance in accordance with the criteria described below.

[Assessment Criteria for Occurrence of Cracks in Humidity/Heat Resistance]

◯: The number of conductive particles in which cracks occur in the solder is not more than 9 per 100 conductive particles connecting electrodes.

Δ: The number of conductive particles in which cracks occur in the solder is not less than 10 and not more than 19 per 100 conductive particles connecting electrodes.

x: The number of conductive particles in which cracks occur in the solder is not less than 20 per 100 conductive particles connecting electrodes.

[Evaluation Criteria for Connection Resistance in Humidity/Heat Resistance]

◯: The connection resistance in the connection structure after being left standing is less than 1.05 times the connection resistance in the connection structure before being left standing.

Δ: The connection resistance in the connection structure after being left standing is not less than 1.05 times and less than 1.1 times the connection resistance in the connection structure before being left standing.

x: The connection resistance in the connection structure after being left standing is not less than 1.1 times the connection resistance in the connection structure before being left standing.

(5) Thermal Shock Resistance Test

Twenty (20) obtained connection structures were provided, respectively, and a cooling/heating cycle test with one hour per one cycle was conducted in which one cycle had a process of holding the temperature at −40° C. for 10 minutes, then increasing the temperature to 85° C. and holding this temperature for 10 minutes, followed by decreasing the temperature to −40° C. Ten (10) connection structures were taken out after 500 cycles and 1000 cycles, respectively.

For 10 connection structures after the cooling/heating cycle test of 500 cycles and 10 connection structures after the cooling/heating test of 1000 cycles, evaluations were made on whether a conduction failure between upper and lower electrodes occurred or not. Assessment was performed on the thermal shock resistance test in accordance with the criteria described below.

[Assessment Criteria for Thermal Shock Resistance Test]

◯: The rate of increase in connection resistance from the connection resistance before the cooling/heating cycle test is not more than 5% in all 10 connection structures.

Δ: The rate of increase in connection resistance from the connection resistance before the cooling/heating cycle test is more than 5% and not more than 10% in all 10 connection structures.

x: The rate of increase in connection resistance from the connection resistance before the cooling/heating cycle test is more than 10% in at least one of 10 connection structures.

The results are shown in Table 1 below.

TABLE 1

|  | Ex. 1 | Ex. 2 | Ex. 3 | Ex. 4 | Ex. 5 | Ex. 6 | Ex. 7 | Ex. 8 |
| --- | --- | --- | --- | --- | --- | --- | --- | --- |
| Thermosetting compound 1 | 10 |  |  |  | 10 | 10 | 10 | 10 |
| Thermosetting compound 2 |  | 10 |  |  |  |  |  |  |
| Thermosetting compound 3 |  |  | 10 |  |  |  |  |  |
| Thermosetting compound 4 |  |  |  | 10 |  |  |  |  |
| Thermal curing agent A |  |  |  |  |  |  |  |  |
| Thermal cation generator 1 | 0.6 |  |  |  | 0.6 |  |  |  |
| Thermal cation generator 2 |  | 0.6 |  |  |  | 0.6 |  |  |
| Thermal cation generator 3 |  |  | 0.6 | 0.6 |  |  | 0.6 | 0.6 |
| Thermal radical generator 1 | 0.05 | 0.05 | 0.05 | 0.05 | 0.05 | 0.05 | 0.05 | 0.05 |
| Thermal radical generator 2 |  |  |  |  |  |  |  |  |
| Adhesion imparting agent | 0.2 | 0.2 | 0.2 | 0.2 | 0.2 | 0.2 | 0.2 | 0.2 |
| Flux | 0.1 | 0.1 | 0.1 | 0.1 | 0.1 | 0.1 | 0.1 | 0.1 |
| Conductive Particle 1 | 5.4 | 5.4 | 5.4 | 5.4 |  |  |  |  |

TABLE 1-continued

|  |  | | | | | | | | |
|---|---|---|---|---|---|---|---|---|---|
|  | Conductive Particle 2 | | | | | 5.4 | | | |
|  | Conductive Particle 3 | | | | | | 5.4 | | |
|  | Conductive Particle A | | | | | | | 5.4 | |
|  | Conductive Particle B | | | | | | | | 5.4 |
|  | Conductive Particle C | | | | | | | | |
| Evaluation | Exothermic peak top P1t temperature (C.) | 108 | 102 | 98 | 95 | 105 | 102 | 95 | 96 |
|  | Endothermic peak top P2t temperature (C.) | 145 | 145 | 145 | 145 | 145 | 145 | 145 | 145 |
|  | Presence/absence of overlap A | Present | Present | Present | Present | Present | Present | Present | Present |
|  | Presence/absence of overlap B | Present | Present | Present | Present | Present | Present | Present | Present |
|  | Presence/absence of overlap C | Absent | Absent | Absent | Absent | Absent | Absent | Absent | Absent |
|  | Conduction test | ⊙⊙ | ⊙⊙ | ⊙⊙ | ⊙⊙ | ⊙⊙ | ⊙⊙ | ⊙⊙ | ⊙⊙ |
|  | Humidity/heat resistance (occurrence of cracks) | ○ | ○ | ○ | ○ | ○ | ○ | ○ | ○ |
|  | Humidity/heat resistance (connection resistance) | ○ | ○ | ○ | ○ | ○ | ○ | ○ | ○ |
|  | Thermal shock test: 500 cycles | ○ | ○ | ○ | ○ | ○ | ○ | ○ | ○ |
|  | Thermal shock test: 1000 cycles | ○ | ○ | ○ | ○ | ○ | ○ | ○ | ○ |

|  |  | Ex. 9 | Ex. 10 | Ex. 11 | Ex. 12 | Ex. 13 | Ex. 14 | Comp. Ex. 1 | Comp. Ex. 2 |
|---|---|---|---|---|---|---|---|---|---|
|  | Thermosetting compound 1 | 10 | | | | | | | |
|  | Thermosetting compound 2 | | 10 | | | | 10 | | |
|  | Thermosetting compound 3 | | | 10 | | 10 | | | |
|  | Thermosetting compound 4 | | | | 10 | | | 10 | 10 |
|  | Thermal curing agent A | 2 | | | | 2 | | 2 | 2 |
|  | Thermal cation generator 1 | | 0.6 | | | | | | |
|  | Thermal cation generator 2 | | | 0.6 | | | | | |
|  | Thermal cation generator 3 | | | | 0.6 | | 0.6 | | |
|  | Thermal radical generator 1 | | | | | | | | |
|  | Thermal radical generator 2 | 0.05 | 0.05 | 0.05 | 0.05 | 0.05 | 0.05 | 0.05 | 0.05 |
|  | Adhesion imparting agent | 0.2 | 0.2 | 0.2 | 0.2 | 0.2 | 0.2 | 0.2 | 0.2 |
|  | Flux | 0.1 | 0.1 | 0.1 | 0.1 | 0.1 | 0.1 | 0.1 | 0.1 |
|  | Conductive Particle 1 | | | | | | | | |
|  | Conductive Particle 2 | | 5.4 | | | | | | |
|  | Conductive Particle 3 | | | 5.4 | | | | | |
|  | Conductive Particle A | | | | 5.4 | | | | |
|  | Conductive Particle B | | | | | 5.4 | | | 5.4 |
|  | Conductive Particle C | 5.4 | | | | | 5.4 | 5.4 | |
| Evaluation | Exothermic peak top P1t temperature (C.) | 124 | 108 | 102 | 94 | 128 | 98 | 151 | 147 |
|  | Endothermic peak top P2t temperature (C.) | 145 | 145 | 145 | 145 | 145 | 145 | 145 | 145 |
|  | Presence/absence of overlap A | Present | Present | Present | Present | Present | Present | Absent | Absent |
|  | Presence/absence of overlap B | Absent | Present | Present | Present | Absent | Present | Present | Present |
|  | Presence/absence of overlap C | Absent | Absent | Absent | Absent | Absent | Absent | Present | Present |
|  | Conduction test | ○ | ⊙⊙ | ⊙⊙ | ⊙⊙ | ○ | ⊙⊙ | X | Δ |
|  | Humidity/heat resistance (occurrence of cracks) | Δ | ○ | ○ | ○ | Δ | ○ | X | X |
|  | Humidity/heat resistance (connection resistance) | Δ | ○ | ○ | ○ | Δ | ○ | X | X |
|  | Thermal shock test: 500 cycles | ○ | ○ | ○ | ○ | ○ | ○ | X | X |
|  | Thermal shock test: 1000 cycles | Δ | ○ | ○ | ○ | Δ | ○ | X | X |

Assessment results of humidity/heat resistance (occurrence of cracks) of Examples 1 to 8, 10 to 12 and 14 were all "○", but the number of conductive particles in which cracks occurred in evaluation of humidity/heat resistance (occurrence of cracks) of Example 14 was smaller than the number of conductive particles in which cracks occurred in evaluation of humidity/heat resistance (occurrence of cracks) of Examples 1 to 8 and 10 to 12. That is, the evaluation result of humidity/heat resistance (occurrence of cracks) of Example 14 was better than the evaluation result of humidity/heat resistance (occurrence of cracks) of Examples 1 to 8 and 10 to 12.

EXPLANATION OF SYMBOLS

1: Conductive particle
1a: Surface
2: Resin particle
2a: Surface
3: Conductive layer
4: First conductive layer
4a: Surface
5: Solder layer
5a: Melted solder layer part
11: Conductive particle
12: Solder layer
16: Solder particle
21: Connection structure
22: First connection object member
22a: Surface
22b: First electrode
23: Second connection object member
23a: Surface
23b: Second electrode
24: Connection part

The invention claimed is:
1. A conductive material comprising: a binder resin; and conductive particles each having a solder at a conductive surface,
wherein the binder resin comprises a curable compound capable of being cured by heating, and a thermal curing agent, and
an exothermic peak top temperature in curing of the binder resin is lower than an endothermic peak top temperature in melting of the solder, when the binder resin and the solder in the conductive particles are each heated at a temperature rising rate of 10° C./minute to perform differential scanning calorimetry.

2. The conductive material according to claim 1,
wherein a difference between the exothermic peak top temperature in curing of the binder resin and the endothermic peak top temperature in melting of the solder is 30° C. or less.

3. The conductive material according to claim 1,
wherein there is an overlap between a temperature range of an exothermic peak in curing of the binder resin and a temperature range of an endothermic peak in melting of the solder, when the differential scanning calorimetry is performed.

4. The conductive material according to claim 3,
wherein there is an overlap between a temperature range of an exothermic peak part in curing of the binder resin, which shows an exothermic amount equal to or more than 1/10 of an exothermic amount at the exothermic peak top in curing of the binder resin and a temperature range of an endothermic peak part in melting of the solder, which shows an endothermic amount equal to or more than 1/10 of an endothermic amount at the endothermic peak top in melting of the solder when the differential scanning calorimetry is performed.

5. The conductive material according to claim 1,
wherein the thermal curing agent comprises a thermal cation generator.

6. The conductive material according to claim 1,
wherein the thermal curing agent comprises a thermal radical generator.

7. The conductive material according to claim 1,
wherein the conductive particle comprises a base material particle and a solder layer arranged on the surface of the base material particle.

8. The conductive material according to claim 1,
wherein the binder resin comprises a flux.

9. The conductive material according to claim 1,
wherein the conductive material is an anisotropic conductive material.

10. A connection structure comprising;
a first connection object member having a first electrode at a surface:
a second connection object member having a second electrode at as surface; and
a connection part connecting the first and the second connection object members,
wherein the connection part is formed by the conductive material according to claim 1, and
the first electrode and the second electrode are electrically connected by the conductive particles.

11. The conductive material according to claim 2,
wherein there is an overlap between a temperature range of an exothermic peak in curing of the hinder resin and a temperature range of an endothermic peak in melting of the solder, when the differential scanning calorimetry is performed.

12. The conductive material according to claim 11,
wherein there is an overlap between a temperature range of an exothermic peak part in curing of the binder resin, which shows an exothermic amount equal to or more than 1/10 of an exothermic amount at the exothermic peak top in curing of the binder resin and a temperature range of an endothermic peak part in melting of the solder, which shows an endothermic amount equal to or more than 1/10 of an endothermic amount at the endothermic peak top in melting of the solder, when the differential scanning calorimetry is performed.

* * * * *